United States Patent [19]

Haferl

[11] 4,081,722
[45] Mar. 28, 1978

[54] SIGNAL PROCESSOR FOR SWITCHED VERTICAL DEFLECTION SYSTEM

[75] Inventor: Peter Eduard Haferl, Adliswil, Switzerland

[73] Assignee: RCA Corporation, New York, N.Y.

[21] Appl. No.: 766,562

[22] Filed: Feb. 7, 1977

[30] Foreign Application Priority Data

Mar. 19, 1976 United Kingdom ............... 11271/76

[51] Int. Cl.² .............................................. H01J 29/72
[52] U.S. Cl. .................................... 315/393; 315/408
[58] Field of Search ............... 315/387, 389, 399, 393, 315/408, 410

[56] References Cited

U.S. PATENT DOCUMENTS 3,452,244  6/1969  Dietz ................................... 315/408

Primary Examiner—Maynard R. Wilbur
Assistant Examiner—T. M. Blum
Attorney, Agent, or Firm—Eugene M. Whitacre; Paul J. Rasmussen

[57] ABSTRACT

A modulator stage of a switched vertical deflection amplifier produces pulse width modulated gating signals obtained by modulating horizontal rate pulses including a ramp portion at a vertical deflection rate. The gating signals control switches coupled between a source of horizontal retrace pulses and a capacitor for charging the capacitor with decreasing and increasing amounts of energy during respective first and second intervals during each vertical trace interval for producing a sawtooth current in a vertical deflection winding coupled to the capacitor. A generator adds a nonlinear component to the ramp portions of the horizontal rate pulses for altering the gain of the amplifier during the vertical trace interval for producing a scanning current with a desired degree of linearity.

5 Claims, 5 Drawing Figures

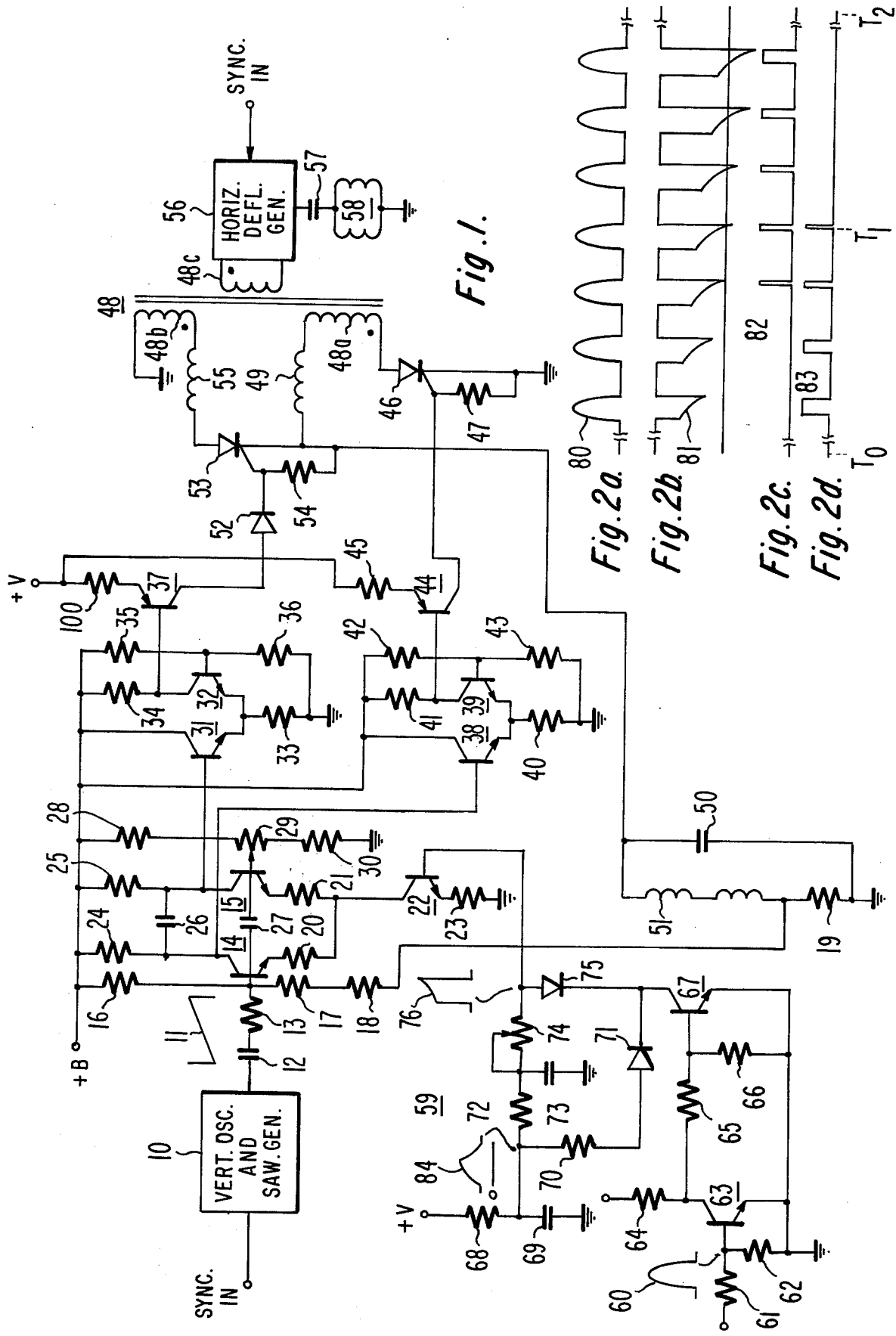

SIGNAL PROCESSOR FOR SWITCHED VERTICAL DEFLECTION SYSTEM

BACKGROUND OF THE INVENTION

This invention relates to a signal processor useful with switched mode deflection systems such as utilized in television receivers.

U.S. application Ser. No. 595,809 filed July 11, 1975 by Peter Eduard Haferl and entitled "SWITCHED VERTICAL DEFLECTION SYSTEM" discloses a switched mode vertical deflection system in which two switches are operated to couple horizontal rate retrace pulses to charge a capacitor which is in parallel with the vertical deflection winding. A first switch is closed for decreasing periods during successive horizontal retrace periods during a first portion of each vertical trace interval to charge the capacitor to a decreasing voltage level of one polarity. The second switch is closed for increasing periods during a second portion of each vertical trace interval to charge the capacitor with an increasing voltage of the opposite polarity. The capacitor discharges through the vertical deflection winding, causing a sawtooth scanning current to flow through the winding. The switches may be SCR's gated into conduction during the horizontal retrace periods by pulse width modulated signals obtained from a stage in which horizontal rate sawtooth signals are modulated by a vertical rate signal. As also disclosed in the referenced application, the levels of the signals coupled to the modulators may be adjusted so that the two switches overlap in conduction for varying the amount of side pincushion distortion correction provided by the loading of the horizontal deflection circuit at the vertical rate.

The horizontal retrace voltage pulses utilized for charging the capacitor are essentially sinewave shaped. Even when higher harmonic tuning of the flyback transformer is utilized the pulse still is not rectangular but has nonlinearly shaped leading and trailing edges. In the center region of the vertical trace interval, when the gating signals cause just a portion of the retrace pulse trailing edge to charge the capacitor, the rapidly decreasing trailing edge results in a lesser charge than desired because the linearly operated modulators do not compensate for the slope on the retrace pulse. The amplitude feedback in the switched vertical circuit causes the error amplifier to react, but in a linear manner, so the modulator produces a wider gating pulse compensation. The longer closing time of the switch then passes more of the trailing portion of the retrace pulse, in which the voltage increases nonlinearly because of the pulse slope, and the charge voltage across the capacitor increases beyond that level which is necessary to linearize the gain of the amplifier and the vertical rate sawtooth scanning current in the deflection winding. The result is an instability in the amplifier during the center portion of the vertical trace interval which may produce the effect of oscillations in the amplifier and a resultant undesirable nonlinearity in the scanning current. The effect of this instability may be more pronounced when the signal levels are adjusted so that the two switches overlap in conduction at the center portion of the vertical trace interval.

BRIEF DESCRIPTION OF THE DRAWINGS

FIG. 1 is a block and schematic circuit diagram of a deflection system embodying the invention; and FIGS. 2a–2d illustrate waveforms obtained at various points in the circuit of FIG. 1.

DESCRIPTION OF THE INVENTION

A vertical rate oscillator and sawtooth generator 10 responsive to a source of vertical rate sync pulses, not shown, produces a positive going vertical rate sawtooth voltage waveform 11 which is coupled through a capacitor 12 and resistor 13 to the base of a transistor 14 in a switched vertical deflection circuit. Transistors 14 and 15 are coupled to form a phase splitting differential amplifier stage. Resistors 24 and 25 respectively are coupled between the collectors of transistors 14 and 15 and B+ and resistors 20 and 21 respectively are coupled between the emitters of transistors 14 and 15 and the collector of transistor 22. The gain of the differential stage is controlled by the ratio of resistors 20 and 21 to resistors 24 and 25. Capacitor 27 decouples the bases of transistors 14 and 15 and suppresses high frequency parasitic signals by the common mode operation of transistors 14 and 15. Capacitor 26 is an RF bypass affecting only the vertical rate signals as the horizontal rate signals at the collectors have substantially the same amplitude.

Series coupled resistors 16, 17, 18 and 19 coupled between B+ and ground bias the base of transistor 14. Resistors 28 and 30 and potentiometer 29 bias the base of transistor 15. Potentiometer 29 serves as a centering control by producing a differential voltage change at the collectors of transistors 14 and 15, resulting in a differential change in the conduction time of the switch SCR's 53 and 46 to effect vertical raster centering on the television picture tube.

Transistor 22 serves as a keyed current source for the differential phase splitter and has its base coupled to a source of nonlinear horizontal rate signals 76 obtained from a horizontal rate generator 59 and its emitter coupled to ground through a resistor 23.

The collector of transistor 15 is coupled to the base of a transistor 31 which with a transistor 32 forms a first pulse width modulator. The collector of transistor 14 is coupled to the base of a transistor 38 which with a transistor 39 forms a second pulse width modulator. The bases of transistors 32 and 39 respectively are biased by resistors 35 and 36, and resistors 42 and 43 coupled between B+ and ground. The first and second modulators respectively have common emitter resistors 33 and 40 and load resistors 34 and 41.

The first modulator drives a driver stage comprising a transistor 37 having its emitter coupled through a resistor 100 to +V and its collector coupled through a disconnect diode 52 to the gate electrode of a first SCR switch 53. The second modulator drives a second driver stage comprising a transistor 44 which has its emitter coupled through a resistor 45 to +V and its collector coupled to the gate electrode of a second SCR switch 46.

The switched vertical deflection system utilizes horizontal retrace pulse energy which is obtained from a horizontal deflection generator 56 synchronized by a source of horizontal rate sync pulses, not shown, obtained in a conventional manner elsewhere in the television receiver. Generator 56 provides scanning current through an S-shaping capacitor 57 to a pair of parallel connected horizontal deflection coils 58 coupled to ground. Generator 56 also energizes a primary winding 48c of a horizontal output transformer 48. A first secondary winding 48b is serially coupled with an inductor 55, SCR 53 and capacitor 50 to ground. Another secondary winding 48a is serially coupled with SCR 46, inductor 49 and capacitor 50 to ground. Windings 48a and 48b are poled as indicated and serve as voltage sources providing positive going horizontal retrace pulse voltages at the anodes of SCR 53 and 46. These voltages charge capacitor 51, coupled in parallel with a pair of serially coupled vertical deflection windings 51, with opposite polarity voltage during respective first and second portions of each vertical deflection trace interval.

As disclosed in the aforementioned application, during the first half of each vertical trace interval SCR 53 is gated on during each horizontal retrace period and the retrace pulses 80 of FIG. 2a obtained at winding 48b charge capacitor 50 positively through inductor 55 in a resonant manner. SCR 53 is rendered nonconducting following each horizontal retrace pulse as the negative voltage causes the capacitor 50 charging current to decrease to zero. SCR 53 is enabled for conduction by switching signals 83 of FIG. 2d obtained from the first pulse width modulator. It is noted that the leading edge of signals 83 are increasingly delayed with respect to the leading edge of each horizontal retrace pulse 80 the beginning of vertical trace at $T_0$ to the center of trace occurring around $T_1$. Thus SCR 53 conducts decreasing amounts of horizontal energy during this interval and capacitor 50 is charged with a decreasing positive voltage during this interval. During the same interval $T_0 - T_1$, capacitor 50 discharges through vertical deflection winding 51 and resistor 19 to ground, producing a decreasing positive sawtooth scanning current in the winding 51. Similarly, during the second half, $T_1 - T_2$, of each vertical trace interval SCR 46 is enabled for conduction by switching signals 82 of FIG. 2c obtained from the second pulse width modulator. During $T_1 - T_2$ capacitor 50 is charged to an increasingly negative voltage by the horizontal retrace pulses obtained from winding 48a. The discharge of capacitor 50 during $T_1 - T_2$ produces an increasingly negative sawtooth scanning current in vertical deflection winding 51. During vertical retrace, SCR 46 is disabled by the absence of switching signals and the deflection current in winding 51 reverses as winding 51 resonates with capacitor 50.

The two SCR's 53 and 46 may both conduct for a portion of the vertical interval extending from the center of trace $T_1$ by adjusting signal levels in the modulator and signal processing section of the circuit to provide a control of the amount of side pincushion correction achieved by the loading of the horizontal deflection system at the vertical rate.

The remaining portion of FIG. 1 discloses a horizontal rate generator 59 which produces horizontal rate pulses 76 occurring during each horizontal retrace interval and which include a nonlinear ramp portion on top of a pedestal portion for controlling the gain of the vertical amplifier to reduce the possible instability condition referred to above.

Horizontal retrace pulses 60 such as may be obtained from a suitable winding of transformer 48 are coupled by resistors 61 and 62 to the base of a transistor 63 which serves as an inverting amplifier. The collector of transistor 63 is coupled through a load resistor 64 to +V and through resistors 65 and 66 to the base of a transistor 67 which serves as a capacitor discharge switch.

A resistor 68 and a capacitor 69 are serially coupled between +V and ground, and the junction thereof is coupled through a resistor 70 and series coupled diode 71 to the collector of switch transistor 67, the latter three elements defining a discharge path for capacitor 69.

The junction of resistor 68 and capacitor 69 is also coupled through a resistor 72, a potentiometer 74 and a diode 75 to the collector of transistor 67, the latter three elements defining a discharge path for a capacitor 73 coupled between the junction of resistor 72 and potentiometer 74 and ground. Diodes 71 and 75 serve to isolate the discharge paths of capacitors 69 and 73.

In the time between horizontal retrace pulses 60 applied to the generator 59, transistor 63 is nonconducting and transistor 67 is conducting. Capacitors 69 and 73 have discharged through diodes 71 and 75 respectively. A steady state DC current flows in a first path from +V through resistors 68 and 70, diode 71 and transistor 67, establishing a first pedestal voltage at the junction of resistors 68 and 70. A steady state DC current also flows in a second path from +V through resistors 68 and 72, potentiometer 74, diode 75 and transistor 67, establishing a second pedestal voltage across capacitor 73.

In operation, retrace pulse 60 causes transistor 63 to conduct and transistor 67 to cutoff. With transistor 67 cutoff, diodes 71 and 75 can no longer conduct the interpulse current and capacitor 69 starts to charge positively from the +V supply through resistor 68, the charge being added to the steady state voltage developed earlier across capacitor 69. This charging voltage waveform is illustrated by waveform 84. Essentially sawtooth voltage waveform 84 is transformed to a sawtooth charging current for capacitor 73. Capacitor 73 integrates this sawtooth waveform into a parabolic waveform which, as illustrated by voltage waveform 76, sits on top of the pedestal voltage which was developed across capacitor 73 during the steady state interpulse period. Potentiometer 74 determines primarily the height of the pedestal voltage of waveform 76. Thus generator 59 produces horizontal rate pulses which include a nonlinear (parabolic) ramp portion.

Pulses 76 control the conduction of keyed current source transistor 22, which causes the nonlinear horizontal rate pulses to be superimposed on a vertical sawtooth of opposite phase appearing at the collectors of transistors 14 and 15. Vertical rate sawtooth waveform 11 causes first transistor 15 and then transistor 14 to conduct the most during each vertical trace interval as waveform 11 at first holds the base of transistor 14 below and then above the fixed potential at the base of transistor 15. The collector voltage of transistor 14 is illustrated by waveform 81 of FIG. 2b. It is noted that the collector voltage of transistor 15 would be similar but the negative going horizontal pulses would be superimposed on a positive going vertical rate sawtooth voltage.

The collector voltages of transistors 14 and 15 are coupled respectively to the bases of transistors 38 and 31 of the second and first modulator stages. In each of the modulators the voltage at the base of the transistors 31 and 38 is compared with the DC reference level voltage at the bases of respective transistors 32 and 39. The reference level voltage at the base of transistor 39 is illustrated by the straight line portion of FIG. 2b. When the base voltage (waveform 81 of FIG. 2b) of transistor 38 falls below the DC level at the base of transistor 39, transistor 39 conducts, turning on driver transistor 44 which produces at its collector the switching signals illustrated by pulses 82 of FIG. 2c. Pulses 82 then enable SCR 46 for conduction for charging capacitor 50 and producing the negative sawtooth scanning current through vertical deflection winding 51 as described above.

The first modulator comprising transistors 31 and 32 operates in a similar manner, causing switching signals to be developed at the collector of driver transistor 37 as illustrated by pulses 83 of FIG. 2d. These pulses enable SCR 53 to charge capacitor 50 positively for producing the positive sawtooth scanning current through deflection winding 51.

The use of the double integration networks including capacitors 69 and 73 and their associated resistors in generator 59, the horizontal rate nonlinear waveforms 76 are developed which change the gain of the respective modulators during the portion of the vertical trace interval during which each produces the switching signals. The amount of overlap of the switching signals of FIGS. 2c and 2d is controlled by the setting of potentiometer 74. By inspection of FIGS. 2b and 2c it can be seen that for linear incremental changes in the amplitude of the linear vertical sawtooth on which nonlinear horizontal pulses 81 are superimposed a series of nonlinear width modulated switching signals 82 are produced. These switching signals altering the gain of the vertical amplifier during the vertical trace interval in a manner to compensate for the nonlinear shaped horizontal retrace pulses 80 which serve as the charging source for the vertical charging capacitor 50 as well as to compensate for the instability occurring when both SCR's are conducting near the center of the vertical trace.

In addition to stabilizing the gain of the vertical amplifier by the use of nonlinearly modulated switching signals, the present circuit provides an advantageous arrangement for superimposing the horizontal signals on the vertical sawtooth. The use of the horizontal rate keyed current source transistor 22 in the differential phase splitter stage greatly reduces the crosstalk between the two modulators because the horizontal source is so far removed from the actual modulator stages comprising transistors 31-32 and 38-39.

The following is a listing of component values for some circuit elements in FIG. 1.

R68: 2.2kΩ
R70: 330Ω
R72: 10kΩ
R74: 10kΩ
C69: 0.01μf
C73: 4700μμf

What is claimed is:

1. A signal processor for a switched vertical deflection system, comprising:
   a source of horizontal rate energy;
   switching means coupling said horizontal energy to capacitance means;
   a vertical deflection winding coupled to said capacitance means;
   a source of vertical rate signals;
   a horizontal rate generator producing horizontal rate signals; and
   modulating means coupled to said horizontal rate generator, said source of vertical signals and to said switching means for producing switching signals at a horizontal rate modulated by said vertical signals for controlling said switching means such that said capacitor is charged with decreasing amounts of said horizontal rate energy during a first portion of each vertical trace interval and with increasing amounts of said horizontal energy during a second portion of said vertical trace interval, the discharge of said capacitor providing a sawtooth scanning current in said vertical deflection winding;
   said horizontal rate generator including means for producing said horizontal rate signals including a nonlinear ramp portion for varying the position of said horizontal rate switching signals and thereby the gain of said vertical system during said trace interval.

2. A signal processor according to claim 1 wherein said horizontal rate generator includes switching means producing said horizontal rate signals during each horizontal retrace interval.

3. A signal processor according to claim 2 wherein said horizontal rate generator includes first charging means coupled to said switching means for producing said ramp portion of said horizontal rate signals.

4. A signal processor according to claim 3 wherein said horizontal rate generator includes second charging means coupled to said first charging means and said switching means for further altering the shape of the ramp portion of said horizontal rate signals.

5. A signal processor according to claim 1 wherein negative feedback means are coupled to said vertical deflection winding and to the portion of said modulating means coupled to said source of vertical rate signals.

* * * * *